(12) United States Patent
Liu

(10) Patent No.: US 6,668,360 B1
(45) Date of Patent: Dec. 23, 2003

(54) AUTOMATIC INTEGRATED CIRCUIT DESIGN KIT QUALIFICATION SERVICE PROVIDED THROUGH THE INTERNET

(75) Inventor: Louis Liu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 146 days.

(21) Appl. No.: 09/755,569

(22) Filed: Jan. 8, 2001

(51) Int. Cl.⁷ ............................................. G06F 17/50
(52) U.S. Cl. ................................................ 716/4; 716/1
(58) Field of Search ......................................... 716/4, 1

(56) References Cited

U.S. PATENT DOCUMENTS

| | | | |
|---|---|---|---|
| 4,922,432 A | 5/1990 | Kobayashi et al. | 364/490 |
| 5,348,902 A | 9/1994 | Shimada et al. | 437/51 |
| 5,353,234 A * | 10/1994 | Takigami | 716/15 |
| 5,623,418 A * | 4/1997 | Rostoker et al. | 703/13 |
| 5,793,641 A | 8/1998 | Sayah | 364/488 |
| 5,831,868 A | 11/1998 | Beausang et al. | 364/489 |
| 5,856,927 A | 1/1999 | Greidinger et al. | 364/491 |
| 5,903,466 A | 5/1999 | Beausang et al. | 364/488 |
| 5,956,256 A | 9/1999 | Rezek et al. | 364/489 |
| 5,987,086 A * | 11/1999 | Raman et al. | 716/1 |
| 6,023,565 A * | 2/2000 | Lawman et al. | 716/1 |
| 6,058,252 A | 5/2000 | Noll et al. | 395/500 |

* cited by examiner

Primary Examiner—Leigh M. Garbowski
Assistant Examiner—Brandon Bowers
(74) Attorney, Agent, or Firm—George O. Saile; Stephen B. Ackerman

(57) ABSTRACT

A circuit qualification system is constructed to allow multiple vendors or circuit designers to automatically qualify their integrated circuit designs for use on the same die providing a single integrated circuit design which is qualified to work under pre-specified conditions. This qualification system contains knowledge of design rules, design automation tools, design automation licenses, and a qualification flow which is the path the automatic qualification system follows based on user input selections. The qualification or common verification system, which is available via the Internet or some other communication network, provides circuit designers with an interface where circuit designs can be submitted for automatic qualification. This interface informs the circuit designers how to submit the required data and to setup the qualification options. The interface also provides an output to the circuit designers telling them if their circuit design is error-free and if it passes verification and qualification and licensing for the overall integrated circuit design.

14 Claims, 5 Drawing Sheets

FIG. 1 – Prior Art

AUTOMATIC INTEGRATED CIRCUIT DESIGN KIT QUALIFICATION SERVICE PROVIDED THROUGH THE INTERNET

BACKGROUND OF THE INVENTION

1. Field of the Invention

This invention relates to the qualifying of circuits and process parameters used to create integrated circuit cell libraries. More particularly, this invention relates to the automatic qualification of many varied circuits and circuit cell libraries which are created by multiple independent design groups and which are used on the same chip die.

2. Description of Related Art

Today, many integrated circuit (IC) designers face the problem of both errors in the circuits themselves and incompatibility caused by different modeling properties from various system macros coming from different design groups. It is the job of the circuit provider to make sure that the delivered design is error free and models and simulates correctly. This verification flow is shown in FIG. 1. All of the steps, which follow below, have tools or application programs available, which allow the computer to assist in the design. Also, the actual design databases, including design rules which govern spacing of wiring on the chip design, simulation models of the logic blocks, technology definition including the semiconductor layout of the transistors and the integrated circuit database which describes the function of the transistors, all reside on the computer. These design databases interface with the software tools. The accuracy of the databases and the design tools will increase the success of designers achieving their objective of error-free designs which work the first time they are fabricated in silicon. This fact causes designers of integrated circuits to invest heavily in design tools and design database technology.

FIG. 1 shows the High Level Design 110, which is a formal description of the functional idea, which is to be implemented in circuitry. The high-level design 110 can consist of a written document with high level flow diagrams and/or a high level description in a hardware description language such as HDL. The detailed schematic 120 contains functional inputs and outputs of the integrated circuit, which interface with other circuits on a silicon chip or with the primary inputs and outputs of the silicon chip. It also includes a definition of major macros or sub-functional islands such as an Industry Standard Data Network (ISDN) macro, PC bus interface logic which follows the input/output adapter specification for today's personal computers, a memory subsystem and read only memory (ROM). In FIG. 1, logic design synthesis 130, is where logical AND & OR blocks are designed or automatically generated from hardware description language (HDL) descriptions of the design from the high level design 110 and the detailed schematic 120. The AND & OR blocks which result from synthesis are then simulated 140 and tested by applying user-supplied test patterns which test the circuit output function based on the circuit input signals. Simulation 140 allows designers and users of integrated circuits to verify the lower level implementation of the high level design. For instance, the HDL, high level design, is simulated with a set of HDL stimulation test patterns. These same HDL simulation test patterns can be run against the lower level AND/OR synthesized designs. If the low-level logical outputs are checked against the logical outputs of the high-level design descriptions, the synthesis operation was a success.

Next, it is necessary to do physical placement and routing 150 of transistors, electronic components, and wiring using a given semiconductor ground rule set for making integrated circuits on a semiconductor substrate. It represents the physical placement or layout of logic macros or building blocks, such as counters, ANDs, ORs, inverters, and other higher level blocks such as Industry Standard Data Network (ISDN) communication controllers. The placement algorithms use knowledge of the input of the blocks and output lists to optimize the placement of the macros on a silicon die area. Next, a wiring program does the actual connecting of the macro input/output wires between the previously placed macros.

Next, the merging 160 of the physical integrated circuit dimensions of the macros and of the wires connecting the macros. The physical merge is accompanied by a design rule check (DRC) to be sure that the inter-wire spacing rules, device size rules, resistive and capacitive rules are obeyed after the physical merge process has been completed. Then, the final, exhaustive layout verification 170 is done. This step guarantees that the circuit in the mask layout matches the schematic description. This step isolates all connectivity problems. It allows for the merging or importation of other previously designed and verified integrated circuits, which were designed by other groups at other times.

U.S. Pat. No. 5,956,256 (Rezek, et al.) describes a method and apparatus for optimizing a circuit design having multiple cycle-paths. The circuit design having a number of multiple cycle paths may be optimized by identifying at least one of the number of multiple-cycle paths within the circuit design, and identifying the corresponding associated the multiple-cycle paths and replacing those clocks with qualified clocks. The circuit design using qualified replacement clocks is optimized with a standard optimization tool.

U.S. Pat. No. 4,922,432 (Kobayashi, et al.) provides a computer-aided design system and method for designing an application specific integrated circuit which enables a user to define functional architecture independent specifications for the integrated circuit and which translates the functional architecture independent specifications into the detailed information needed for directly producing the integrated circuit. The functional architecture independent specifications of the desired integrated circuit can be defined at the functional architecture independent level in a flowchart format.

U.S. Pat. No. 5,348,902 (Shimada, et al.) describes a method of designing cells applicable to different design automation systems. The cell circuits designed by the different design automation systems, respectively, are demarcated into a logic function portion and an input/output portion. Sets of common lithography patterns for the logic function portions of the cells are determined such that each common lithography pattern set is shared by those cells which have same logic function in the different automation systems.

U.S. Pat. 5,831,868 (Beausang, et al.) describes a computer implemented process and system for providing a test ready compiler with specific information regarding the impact of added scannable cells and resources on its design. In so doing, the test ready compiler optimizes more effectively for added test resources (e.g., scannable cells and other scan routing resources) so that predetermined performance and design related constraints of the design are maintained.

U.S. Pat. No. 6,058,252 (Noll, et al.) describes a system and method for generating effective layout constraints for a circuit design. A netlist data structure representing a circuit configuration has multiple circuit elements and represents static timing information for the circuit configuration. Specified circuit elements to be used for generating the layout constraints are selected. A most critical path through each of the specified circuit elements is identified based upon the static timing information. The layout constraints are generated from the most critical path through each of the specified circuit elements.

SUMMARY OF THE INVENTION

It is the objective of this invention to provide a method for automatically verifying one or several integrated circuits created by one or several design groups. The steps involved in this automatic verification of circuits begin with creating a technology definition database, which details the semiconductor parameters for the for the electronic devices used in the circuits being verified. Next, the simulation model database is created. This database allows the simulation and verification of the logic design of the designer's integrated circuits. Then, a design rule database is created. This details the physical dimension constraints of the integrated circuits. All of the above databases are transferred to a central repository along with a quality assurance or verification process. The designers who are the users of this invention's automatic qualification system are granted a license to use the above central repository. The purpose of the qualification system is to verify the function and structure of the integrated circuit designs. Functional verification involves verifying the logic design and structural verification involves verifying the physical chip design. Errors are automatically reported back to the designer for design correction. The designer can then resubmit the correction integrated circuit design back to the Automatic Qualification method. This submitting, retrieving and correcting of the circuit design continues until the new circuit is error-free.

DETAILED DESCRIPTION OF THE INVENTION

Figure 3:
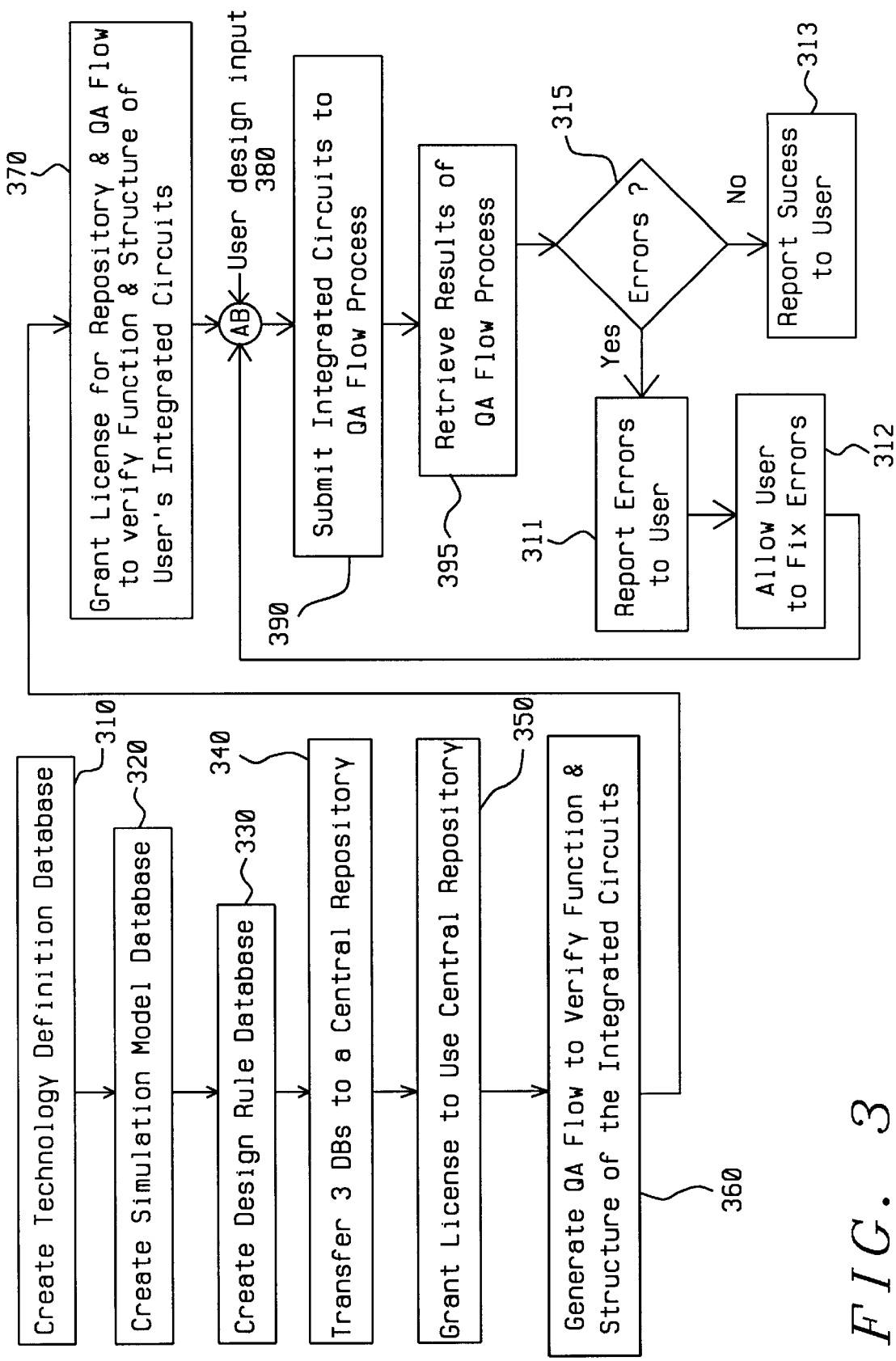
FIG. 3 shows this invention's automatic qualification method.

Refer now to FIG. 3 for a discussion of this invention, which includes a method for automatically qualifying integrated circuits from several designers. The objective for the method is to automatically qualify user integrated circuits, which are submitted at Node AB. The blocks of this method are previously designed and developed by the owner of the automatic qualification-ready semiconductor foundry. For example, the Create Technology Definition Database 310 contains the semiconductor definition or parameters related to the chip technology used. This database 310 may contain the definition of a complementary metal oxide semiconductor (CMOS) process used on the final chips. It will also include CMOS field effect transistor (FET) models, which can be used to model and simulate the logic switching and delays of the transistors.

The creation of a simulation model database 320 is shown in FIG. 3. The foundry, which is the semiconductor manufacturer of chips, creates a database of logic simulation blocks containing representations of ANDs, ORs, inverters, and other low level function blocks. These simulation blocks are used to automatically represent the output of the Create Simulation Model 510 on FIG. 5, which shows the qualification assurance (QA) flow. Qualification assurance is the verification of the function and structure of an integrated circuit design. It is a process which checks that a circuit design functions correctly and is built according to the physical ground rules of a semiconductor process. The creation of a design rule database 330 is shown in FIG. 3. The design rules are derived from the Technology Definition database 310. The design rules include maximum and minimum metal line spacing, maximum and minimum diffusion line spacing, maximum resistive load per CMOS device, maximum capacitive load per CMOS device. These three databases, Technology Definition database 310, Simulation model database 320, and Design Rule database 330 are transferred to a Central Repository 340. The foundry/automatic qualification vendor has the responsibility 350 of obtaining requests for licenses and granting licenses to the circuit designers who use this automatic qualification method. These licenses are permissions to use the three databases discussed above. This step 350 involves negotiation and discussion with the tools and database vendors who are supporting this automatic qualification method.

Figure 5:
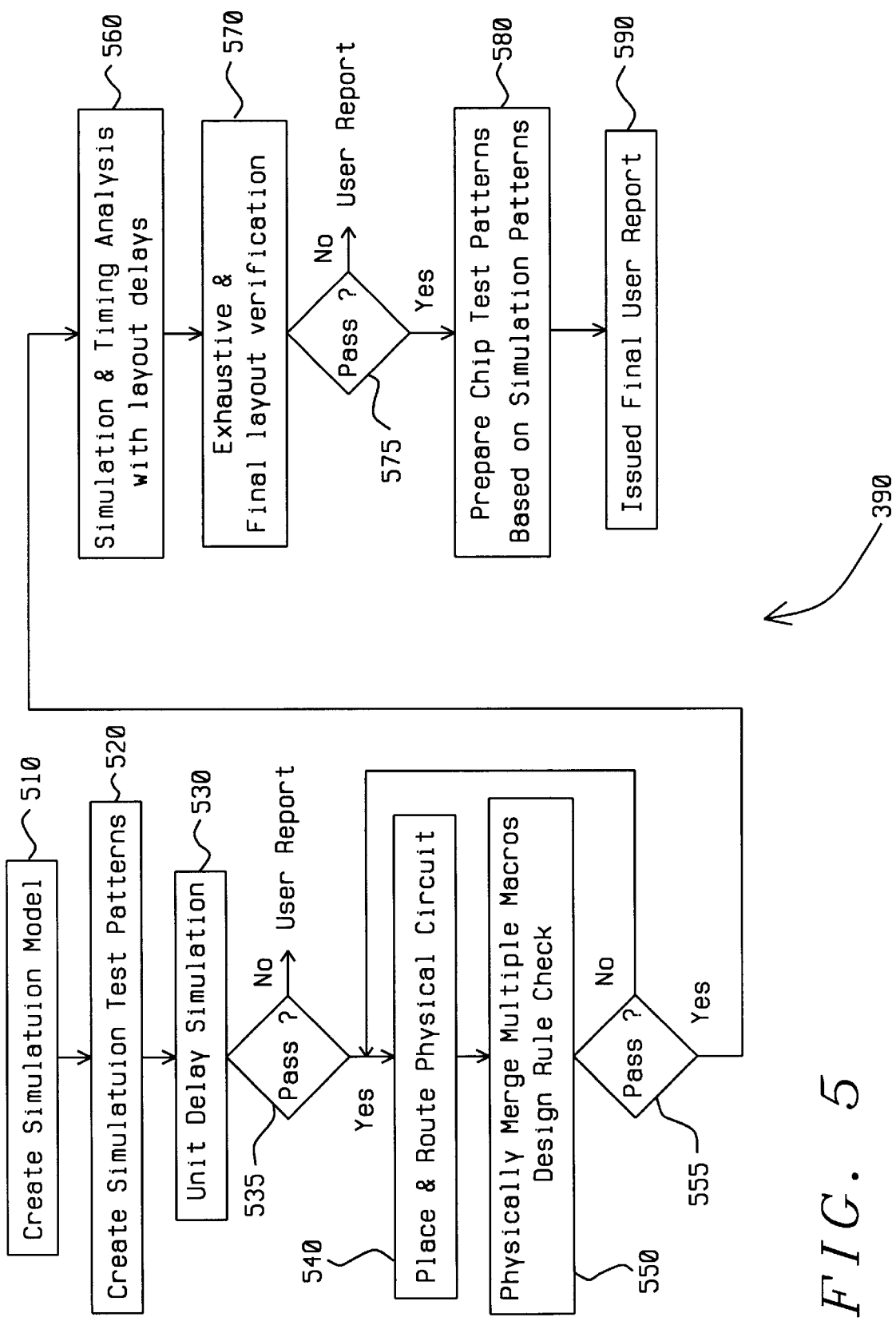
FIG. 5 shows the Qualification Assurance (QA) flow diagram which is a subset of this invention's automatic qualification method of FIG. 3.

Next, the foundry/automatic qualification vendor must generate a Qualification Assurance (QA) flow to verify the function and structure of the integrated circuits 360. This QA flow is shown in FIG. 5 and is described below. License agreements 370 required to be signed by the circuit designers when they are preparing to use the Central Repository databases, the design automation tools and the semiconductor technology.

Node AB is where the user submits integrated circuits to the QA flow process. The external input 380 is where the circuit designer can input various forms of design. These forms include schematics, a hardware description language such as VHDL, machine-generated plots of integrated circuit layouts, and layout description language descriptions of integrated circuit layouts. The first two forms of design input above are at the logic level, while the last two forms of design input are at the physical design level. Typically, the physical design level is used as input for previously used integrated circuit macros or circuit designs. In addition, the vendor or user inputs to the system at node AB a list of logical inputs and outputs required and their specifications. For example, the user's logic has an input line called reset and an output line called Clear. The user specifies required setup time for the input and required output delays for the output. In addition, the user specifies a truth table or input/output cross reference where applicable. This table would contain the ones and zeros required at the outputs for a combination of ones and zeros presented at the inputs. The design files as described above are then submitted to the QA flow 390.

FIG. 5 describes the QA flow 390 method. A simulation model 510 for the design submitted by the integrated circuit designer is created from the Central Repository databases. The central repository databases and the above simulation model are used to create test patterns 520 and expected test results to apply to the simulation model. Next, unit delay simulation 530 of the logic model is performed. This simulation represents basic binary logic levels expected from the circuit 1's and 0's without any circuit delay parameters taken into account. A decision block 535 is used to decide whether to continue with the QA flow based on the unit delay simulation 530 results. If the simulation does not pass and there are simulation errors, an unsuccessful User Report with the failing patterns is generated for the integrated circuit designer and the method flow ends. If the simulation does pass, the method continues on for placement and wire routing 540 of the physical integrated circuit in preparation for a semiconductor photomask for chip fabrication. If the circuit was submitted at the physical design level via a machine-generated plot or via a layout description language, the QA flow bypasses the placement and wire routing 540 to go to step for merging the subject circuit design with other previously designed circuits 550. This step involves merging of the layout description language of all of the macros required for the present chip to be fabricated. In addition, the physical merging step 550 includes the design rule checking of wiring spacing, device physical dimensions and device loading limits. If the design rule check fails at decision block 555, a user report with the failing macros and its failing design rules is generated and transferred to the integrated circuit designer. This failure does not stop the QA flow 390 but the flow continues with feedback to the place and route step 540 to correct the error via a re-placement of the circuits. If the design rule check passes 555, the QA flow continues on to simulation with actual delays and timing analysis 560. This is coupled with exhaustive final layout verification 570. The decision block 575 checks the results of the delay simulation and of the final layout verification, which is checking the placement of devices for optimum delay simulation and circuit performance. This included the testing of the worst case delay paths and any fast path requirements that are specified by the circuit designer. If these tests fail, a user report with the failed delay simulations and with the failed logic delay paths is returned to the integrated circuit designer and the QA flow 390 is ended. If these tests pass 575, the QA flow 390 continues to the preparation of chip test patterns 580 from the unit delay simulation 530 and from the delay simulation tests 560. The same stimulus patterns that were used to simulate the logic models are used to test the final semiconductor integrated circuit chip. Finally, the QA flow 390 issues a final user report 590 indicating successful completion of the QA flow 390. The name and location of the physical design language files which represents the chip design and the test pattern files are listed for the integrated circuit designer. This represents the end of the QA flow 390.

The results 315 from the QA flow process 390 are shown in FIG. 3. If there are no errors at the decision block 315, a report of success is delivered 313 to the user of the automatic qualification method. If there are errors, they are reported to the circuit designers 311. The circuit designers have an opportunity to fix the reported errors 312. The user corrections are submitted to Node AB for another iteration through the QA flow method. This iteration step is repeated until the automatic qualification system reports No Errors 313.

Figure 1:
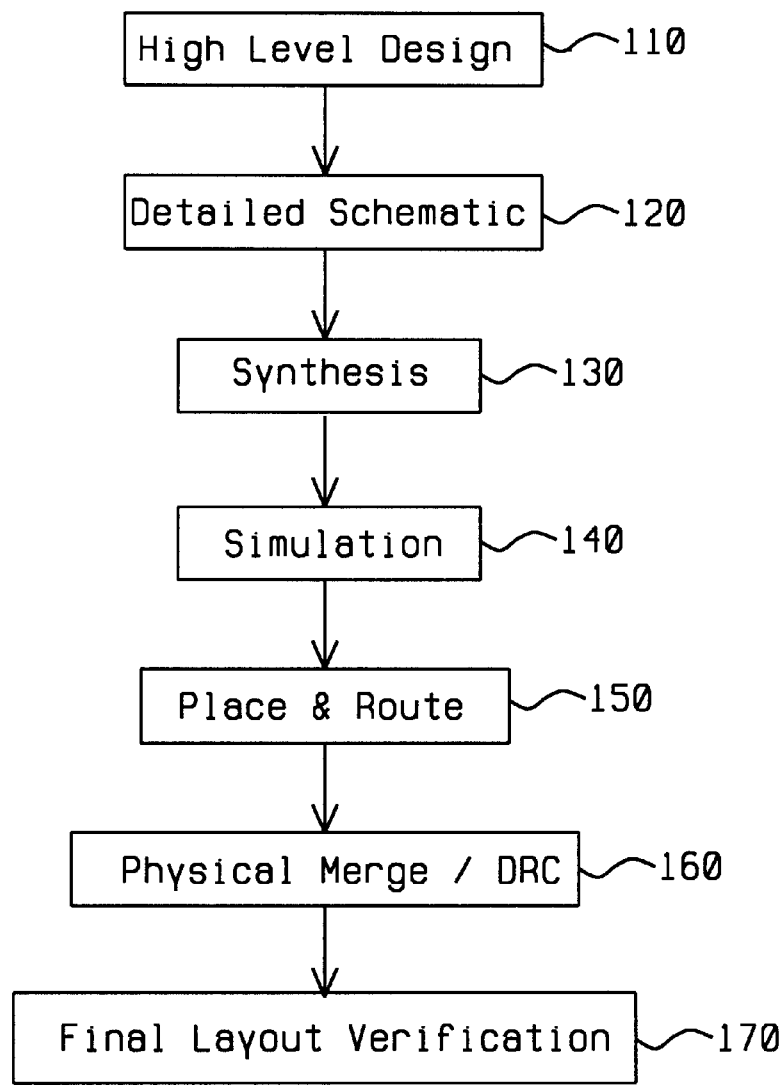
FIG. 1 illustrates a flow diagram of the prior art of integrated circuit design.
Figure 2:
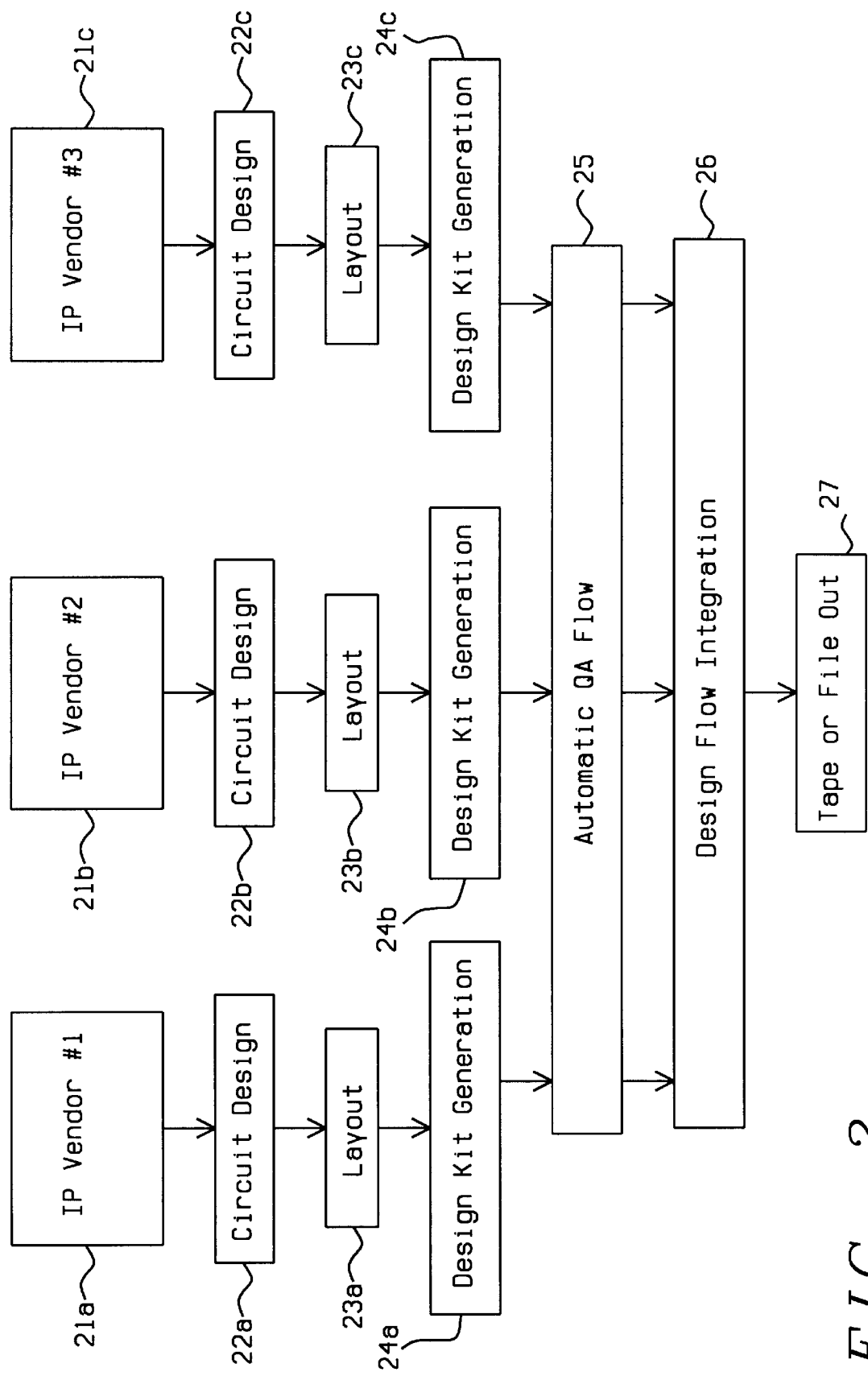
FIG. 2 shows the merging of multiple designs into a common automatic quality assurance (QA) flow of this invention.

Refer to FIG. 2 for an overview diagram, which shows the automatic merging of multiple designs from multiple vendors with the automatic qualification method and system of this invention. Vendor 1 (21a) submits his circuit design 22a via a schematic, hardware description language such as VHDL, computer-generated plot or physical design language. If vendor 1 submits the design as a schematic or VHDL, then the layout step 23a is necessary. If vendor 1 submits a design with physical design language or a plot, the design can proceed to Design Kit Generation 24a. This block represents the central repository for the vendor's design. This repository or database contains the logical, physical and circuit information of the design. It includes simulation models, simulation test patterns, device models with delays, physical layout data and the vendor's specifications for his circuit. The designs of vendors 1, 2 and 3 are merged 25 to produce an integrated and verified design 26. Design flow integration 26 will take care of design rule checking of the merged physical design. In addition, design flow integration 26 will check the logic and specification requirements of the merged design. Finally, design flow integration 26 will produce the file or tape outputs 27 which are required to manufacture the integrated circuit chip.

Figure 4:
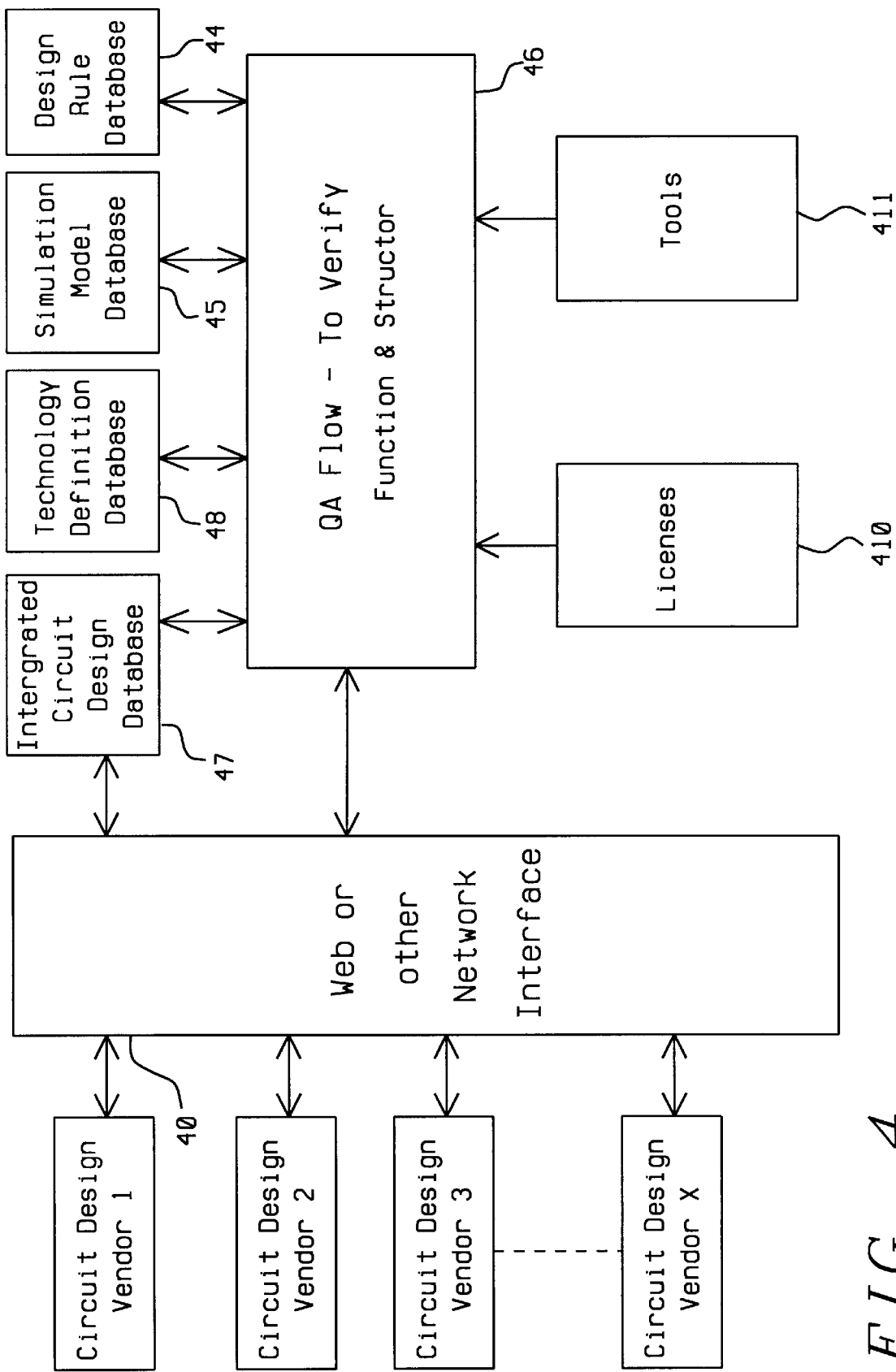
FIG. 4 shows this invention's automatic qualification system.

Refer now to FIG. 4 for a discussion of the system of this invention for automatically qualifying integrated circuit design kits or macros from several design houses. The objective for this system is to automatically qualify user integrated circuits. This automatic qualification takes place via the World Wide Web or some other global digital communication network interface or within a private corporate network 49. Vendors 1, 2, 3, . . . X can interface with the Automatic Qualification System from anywhere in the world via an interface to the World Wide or other global digital communication network interface or private digital communications network. As an example, Vendor 1 interfaces with the network 40, where the vendor or user submits a schematic, VHDL design language, plot, or physical design language. In addition, the vendor or circuit designer submits to the system at 40 a list of logical inputs and outputs required and their specifications. For example, the circuit designer's logic has an input line called reset and an output line called Clear. The circuit designer specifies a required setup time for the input and required output delays for the output. In addition, the circuit designer specifies a truth table or input/output cross-reference where applicable. This table would contain the binary logic levels (1 and 0) required at the outputs for a combination of binary logic levels presented at the inputs. Also, at node 40, Vendor 1 receives the Passing or Failing User Reports mentioned previously as the results of the method for automatically qualifying integrated circuits. The technology definition, simulation model and design rule databases 48, 45, and 44 are prepared by the owner of the automatic qualification system. Vendor #1's design is the integrated circuit database 47 which is submitted via schematic, VHDL, plot or physical design language. The integrated circuit database 47 also contains the final physical design language output produced by this Automatic Qualification System shown in FIG. 5. In summary, the integrated circuit design database 47 contains both the user's logical and physical designs including the original input form of the user's design as well as the final user's design which results from the Qualification Assurance Flow iterations.

The Technology Definition Database (TDD) 48, which contains the semiconductor definition or parameters related to the chip technology used. For example, the TDD database 48 may contain the definition of a CMOS, complementary metal oxide semiconductor, process used on the final chips. It may also include CMOS FET, field effect transistor, models, which can be used to model and simulate the logic switching and delays of the transistors. The output of the TDD 48 combined with the user's physical design 47 goes into the QA flow system 46, which is where the function and structure of the user's integrated circuit design is verified.

The second database is the simulation model database 45. The foundry creates a database of logic simulation blocks containing representations of ANDs, ORs, inverters, and other low level simulation blocks. These simulation blocks together with the user's logic design 47 are used to represent the logic blocks, which are simulated in the QA Flow 46. The third database is the design rule database 44 which is created by the owner automatic qualification system. The design rules are derived from the Technology Definition database 48. The design rules include such 'semiconductor circuit parameters as maximum and minimum metal line spacing, maximum and minimum diffusion line spacing, maximum resistive load per CMOS device, maximum capacitive load per CMOS device.

The design automation tools 411, including all of the application software, which is used in the QA flow 46, to verify the function and structure of the user's design are shown in FIG. 4. These tools include hardware description languages such as VHDL, simulation programs, place and route programs, wiring programs, test pattern generation programs and design rule and layout verification programs. In addition, licensing agreements 410 are required from the circuit designers. They must obtain licenses before completing the automatic qualification of their designs. The licenses are contracts allowing permission to use all of the vendor tools 411 as well as for use of the automatic qualification system owner's semiconductor, circuit and qualification technologies to create the user's integrated circuit chips.

The QA flow 46 is where the user's circuit is modeled, simulated without delays, simulated with delays, placed and routed, physically merged with other designs, design rule checked, layout verified and test pattern generated. The flow of this system block is described in FIG. 5. If any intermediate step of FIG. 5 produces any errors, the errors are conveyed to the circuit designer via a User Report at the web or network interface, 40. It is up to the user to modify or approve an automatic correction by the system of FIG. 4. After the circuit designer's approval, the integrated circuit design database 47, which contains the circuit design is modified to correct the errors reported and the QA flow is repeated. This iteration is repeated until the circuit design passes all of the specified criteria for approval. Again, the user or vendor 1 communicates with the automatic qualification system via the interface 40 in FIG. 4. In summary, the interface at 40 allows the user to efficiently submit designs and design specifications and allows the user to receive User Reports of success or errors, which result from the QA flow system block. When the final User Report succeeds, the user can inform the automatic qualification system to start production of the semiconductor chip and the test patterns for testing the manufactured chip by way of the World Wide Web or other global communications network, or through a private digital communications network.

While this invention has been particularly shown and described with reference to the preferred embodiments thereof, it will be understood by those skilled in the art that various changes in form and details may be made without departing from the spirit and scope of the invention.

What is claimed is:

1. A method for verifying designs of a plurality of integrated circuits created by one or more design groups comprising the steps of:
   obtaining multiple designs, technology rules, and specifications from multiple locations,
   creating a technology definition database detailing physical semiconductor parameters for electronic devices that form said integrated circuits;
   creating a simulation model database detailing electronic component models of the electronic devices;
   creating a design rule database detailing the physical dimension constraints of said integrated circuits;
   transferring the technology database, the simulation model database, and the design rule database to a central data repository;
   granting a license to access to the central data repository to use the technology database, the simulation model database, and the design rule database;
   generating a quality assurance process to verify function and structure of the integrated circuits;
   installing said quality assurance process on said central data repository;
   granting a license to said design groups to have access to said central data repository to use said quality assurance process to verify function and structure of said integrated circuits;
   submitting the integrated circuit designs for verification of function and structure by said quality assurance process;
   retrieving results of said quality assurance process;
   correcting any errors found by said quality assurance process in the integrated circuits; and
   repeating the steps of submitting, retrieving, and correcting until the integrated circuit contains no errors.

2. The method of claim 1 wherein the central data repository is a node of a global computing network, whereby the technology database, the simulation model database, the design rule database, and the quality assurance process are accessed by the design groups through said global computing network.

3. The method of claim 1 where in the quality assurance flow comprises the steps of:
   creating a simulation model for testing the logic and circuit function using the specified requirements;
   creating simulation test patterns which represent the required specified function;
   performing a unit delay simulation to test the logic design with binary logic levels;
   checking if simulation agrees with an original specification of said integrated circuit design;
   issuing a user report if simulation fails in order to inform the design group of said integrated circuits which mistakes were found and to suggest corrections for the errors;
   placing & routing physical circuits according the semiconductor process ground rules in order to prepare for fabrication of the integrated circuits;
   physically merging multiple macros to combine multiple designs from at least one of the design groups; checking design rules of the combined multiple designs to insure the combined design obeys the process ground rules;
   issuing a user report if checking of the design rules fails to inform the designer of the mistakes found; suggesting corrections to errors found with the checking of the design;
   simulating and analyzing timing of the combined multiple designs with layout delays included to test the binary logic levels in the presence of circuit delays;
   verifying exhaustively a final layout of the combined multiple designs to guarantee the semiconductor ground rules are obeyed;
   issuing a user report if simulating of timing and verifying of layout is not successful;
   preparing chip test patterns based on simulation patterns to insure the combined multiple designs; to verifying functioning of semiconductor substrates containing combined multiple designs;

issuing final user report to inform the design group that the combined multiple designs have successfully passed the automatic qualification flow and that the combined multiple design is ready for fabrication.

4. The method of claim 3 further comprising the step of:

combining a group of said combined multiple designs from different design groups on a semiconductor substrate.

5. An apparatus for verifying a design of a plurality of integrated circuits created by one or more design groups comprising:

means for obtaining multiple designs, technology rules, and specifications from multiple locations, means for creating a technology definition database detailing physical semiconductor parameters for electronic devices that form said integrated circuits;

means for creating a simulation model database detailing electronic component models of the electronic devices;

means for creating a design rule database detailing the physical dimension constraints of said integrated circuits;

means for transferring the technology database, the simulation model database, and the design rule database to a central data repository;

means for granting a license to access to the central data repository to use the technology database, the simulation model database, and the design rule database;

means for generating a quality assurance process to verify function and structure of the integrated circuits;

means for installing said quality assurance process on said central data repository;

means for granting a license to said design groups to have access to said central data repository to use said quality assurance process to verify function and structure of said integrated circuits;

means for submitting the integrated circuit designs for verification of function and structure by said quality assurance process;

means for retrieving results of said quality assurance process;

means for correcting any errors found by said quality assurance process in the integrated circuits; and means for repeating the steps of submitting, retrieving, and correcting until the integrated circuit contains no errors.

6. The apparatus of claim 5 wherein the central data repository is a node of a global computing network, whereby the technology database, the simulation model database, the design rule database, and the quality assurance process are accessed by the design groups through said global computing network.

7. The apparatus of claim 5 where in the quality assurance flow comprises the steps of:

means for creating a simulation model for testing the logic and circuit function using the specified requirements;

means for creating simulation test patterns which represent the required specified function;

means for performing a unit delay simulation to test the logic design with binary logic levels;

means for checking if simulation agrees with an original specification of said integrated circuit design;

means for issuing a user report if simulation fails in order to inform the design group of said integrated circuits which mistakes were found and to suggest corrections for the errors;

means for placing & routing physical circuits according the semiconductor process ground rules in order to prepare for fabrication of the integrated circuits;

means for physically merging multiple macros to combine multiple designs from at least one of the design groups; checking design rules of the combined multiple designs to insure the combined design obeys the process ground rules;

means for issuing a user report if checking of the design rules fails to inform the designer of the mistakes found; suggesting corrections to errors found with the checking of the design;

means for simulating and analyzing timing of the combined multiple designs with layout delays included to test the binary logic levels in the presence of circuit delays;

means for verifying exhaustively a final layout of the combined multiple designs to guarantee the semiconductor ground rules are obeyed;

means for issuing a user report if simulating of timing and verifying of layout is not successful;

means for preparing chip test patterns based on simulation patterns to insure the combined multiple designs; to verifying functioning of semiconductor substrates containing combined multiple designs;

means for issuing final user report to inform the design group that the combined multiple designs have successfully passed the automatic qualification flow and that the combined multiple design is ready for fabrication.

8. The apparatus of claim 7 further comprising:

means for combining a group of said combined multiple designs from different design groups on a semiconductor substrate.

9. A system for automatically verifying design of a plurality of integrated circuits created by one or more design organizations, comprising:

An interface for obtaining multiple designs, technology rules, and specifications from multiple locations, A technology definition database containing a description of a semiconductor fabrication process to be used to construct said plurality of integrated circuits;

A simulation model database containing circuit and device models detailing functional operation of circuits and devices incorporated in said plurality integrated circuits;

A design rule database containing a description of physical constraints of electronic devices, geometric constraint of interconnect wiring; and physical separations of the electronic devices and the interconnect wiring;

An integrated circuit database containing a description of the plurality of integrated circuits;

A plurality of design automation apparatus in communication with the technology definition database, the simulation model database, the design rule database and the integrated circuit database for verifying the design of the plurality of integrated circuits; and a verification apparatus coupled to the plurality of design automation apparatus to monitor the operation of the plurality of design automation apparatus, to generate design verification reports indicating correctness of the plurality of said integrated circuits, and to communicate said reports to said design organization.

10. The system of claim 9 further comprising a licensing apparatus to communicate with the verification apparatus to grant permission to the design organization for use of said system.

11. The system of claim 9 further comprising a communication interface in communication with a digital communication network to allow the plurality design organizations to communicate with said system in communication with the integrated circuit database to allow transfer of the description of the plurality of integrated circuits from the design organization to the integrated circuit database, and in communication with the verification apparatus to receive the design verification reports.

12. The system of claim 10 further comprising claim 11 which is in communication with the licensing apparatus through the verification apparatus to communicate requests for permission granting or denying said permission.

13. The system of claim 10 where in the verification apparatus comprises:

a simulation model generator in communication with the simulation model database and the integrated circuit database to create simulation models of the plurality of integrated circuits;

a test pattern generator in communication with the integrated circuits database to define the stimulus to and response from the plurality of integrated circuits;

a unit delay simulator to the simulation model generator and the test pattern generator to simulate the plurality of integrated circuits to verify basic function of said plurality of integrated circuits not including timing delay parameters of the plurality of integrated circuits;

a design rule checking apparatus in communication with the integrated circuits database and the design rule database to compare physical design of the plurality of integrated circuits to the design rule;

a total circuit simulator in communication with the simulation model generator and the test pattern generator to simulate a combination of the plurality of integrated circuit merged for placement on a semiconductor substrate;

a timing analyzer in communication with the simulation model generator and the test pattern generator to analyze timing delays of the merged plurality of integrated circuits;

a physical layout verification apparatus in communication with the design rule database and the integrated circuit design database to verify the placement of components and interconnections of the plurality of integrated circuits merged on the semiconductor substrate;

and a reporting apparatus in communication with the plurality of design organizations to report results of the design rule checking apparatus, the total circuit simulator, the timing analyzer, and the physical layout verification apparatus.

14. A program retention device containing program instruction code executable on at least one networked computing device for verifying a design of a plurality of integrated circuits created by one or more design groups, whereby said program performs the steps of:

obtaining multiple designs, technology rules, and specifications from multiple locations, creating a technology definition database detailing physical semiconductor parameters for electronic devices that form said integrated circuits;

creating a simulation model database detailing electronic component models of the electronic devices;

creating a design rule database detailing the physical dimension constraints of said integrated circuits;

transferring the technology database, the simulation model database, and the design rule database to a central data repository;

granting a license to access to the central data repository to use the technology database, the simulation model database, and the design rule database;

generating a quality assurance process to verify function and structure of the integrated circuits;

installing said quality assurance process on said central data repository;

granting a license to said design groups to have access to said central data repository to use said quality assurance process to verify function and structure of said integrated circuits;

submitting the integrated circuit designs for verification of function and structure by said quality assurance process;

retrieving results of said quality assurance process;

correcting any errors found by said quality assurance process in the integrated circuits; and repeating the steps of submitting, retrieving, and correcting until the integrated circuit contains no errors.

* * * * *